US008753952B2

(12) United States Patent
Summerfelt et al.

(10) Patent No.: US 8,753,952 B2
(45) Date of Patent: Jun. 17, 2014

(54) INTEGRATED CIRCUIT WITH INTEGRATED DECOUPLING CAPACITORS

(75) Inventors: Scott Robert Summerfelt, Garland, TX (US); John A. Rodriguez, Dallas, TX (US); Huang-Chun Wen, Plano, TX (US); Steven Craig Bartling, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 105 days.

(21) Appl. No.: 13/330,833

(22) Filed: Dec. 20, 2011

(65) Prior Publication Data

US 2013/0062733 A1 Mar. 14, 2013

Related U.S. Application Data

(60) Provisional application No. 61/532,446, filed on Sep. 8, 2011.

(51) Int. Cl.
*H01L 21/20* (2006.01)

(52) U.S. Cl.
USPC ............... 438/396; 257/532; 257/E29.343; 257/E21.008; 257/E21.598

(58) Field of Classification Search
USPC ........... 257/532, E29.343, E21.008, E21.598; 438/396
See application file for complete search history.

(56) References Cited

U.S. PATENT DOCUMENTS

| | | | |
|---|---|---|---|
| 5,608,246 A | 3/1997 | Yeager et al. | |
| 5,817,533 A | 10/1998 | Sen et al. | |
| 6,656,748 B2 * | 12/2003 | Hall et al. | 438/3 |
| 6,759,257 B2 | 7/2004 | McCormack et al. | |
| 6,830,938 B1 | 12/2004 | Rodriguez et al. | |
| 2004/0126981 A1 * | 7/2004 | Rao et al. | 438/396 |
| 2008/0308902 A1 * | 12/2008 | Kumura et al. | 257/532 |
| 2008/0315358 A1 | 12/2008 | Shioga et al. | |
| 2010/0065944 A1 * | 3/2010 | Tu et al. | 257/532 |

OTHER PUBLICATIONS

Dimos et al., "Integrated Decoupling Capacitors using Pb(Zr,Ti)O3 Thin Films", MRS Symp. Proc. 433, 305(1996).
Imanaka et al., Decoupling Capacitor with Low Inductance for High-Frequency Digital Applications, Fujitsu Sci. Tech. J., 38, 1 (Jun. 2002), pp. 22-30.
Summerfelt et al., "Embedded Ferroelectric Memory Using a 130-nm 5 Metal Layer CU/FSG Logic Process", Non-Volatile Memory Technology Symposium, 2004 (IEEE, 2004), pp. 153-154.
Jung et al., "Key Integration Technologies for Nanoscale FRAMs", Trans. Ultrasonics, Ferroelectrices, and Frequency Control, vol. 54, No. 12 (IEEE 2007), pp. 2535-2540.

* cited by examiner

*Primary Examiner* — Zandra Smith
*Assistant Examiner* — Jamie C Niesz
(74) *Attorney, Agent, or Firm* — Rose Alyssa Keagy; Wade J. Brady, III; Frederick J. Telecky, Jr.

(57) ABSTRACT

Ferroelectric capacitor structures for integrated decoupling capacitors and the like. The ferroelectric capacitor structure includes two or more ferroelectric capacitors connected in series with one another between voltage nodes. The series connection of the ferroelectric capacitors reduces the applied voltage across each, enabling the use of rough ferroelectric dielectric material, such as PZT deposited by MOCVD. Matched construction of the series-connected capacitors, as well as uniform polarity of the applied voltage across each, is beneficial in reducing the maximum voltage across any one of the capacitors, reducing the vulnerability to dielectric breakdown.

4 Claims, 13 Drawing Sheets

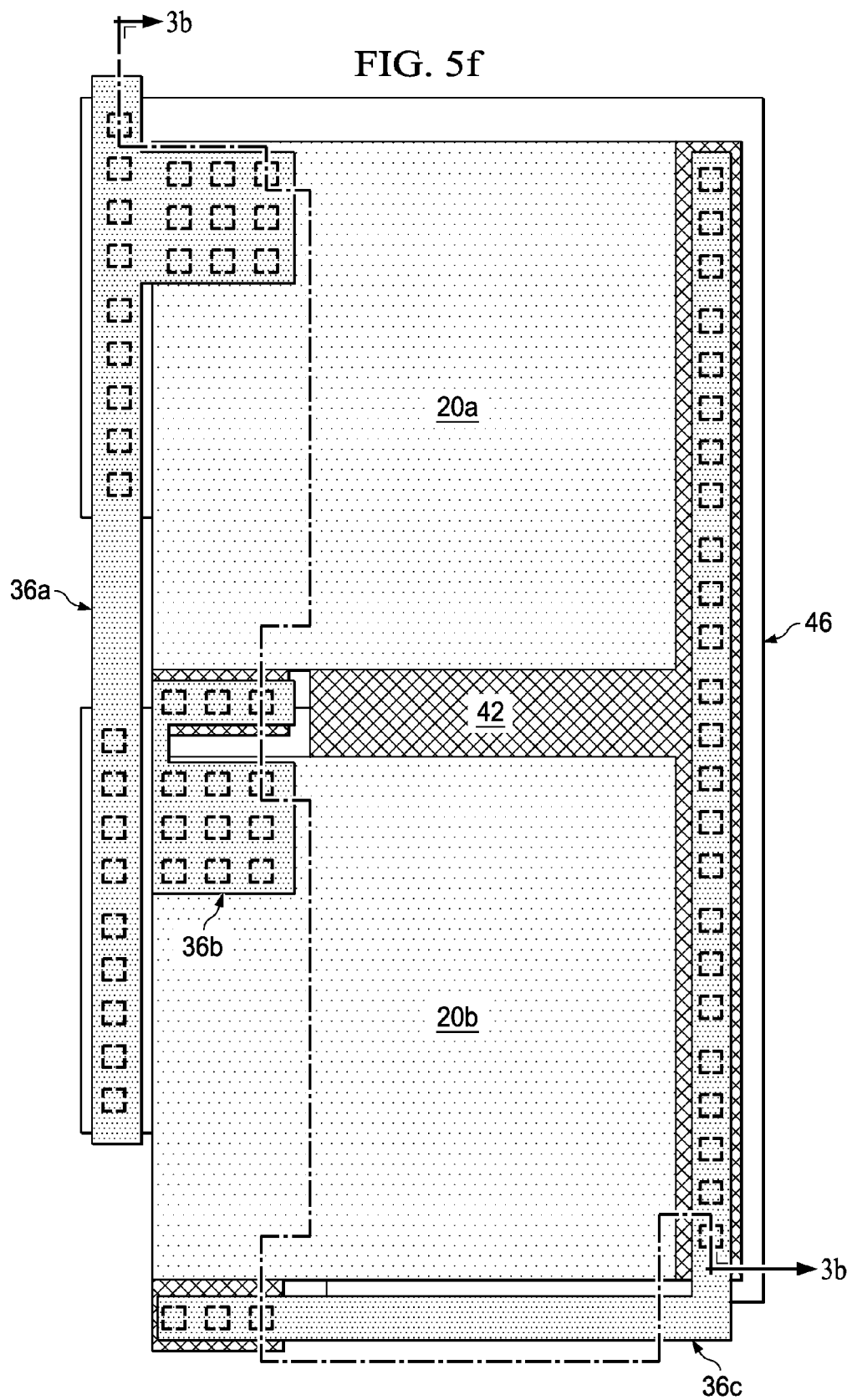

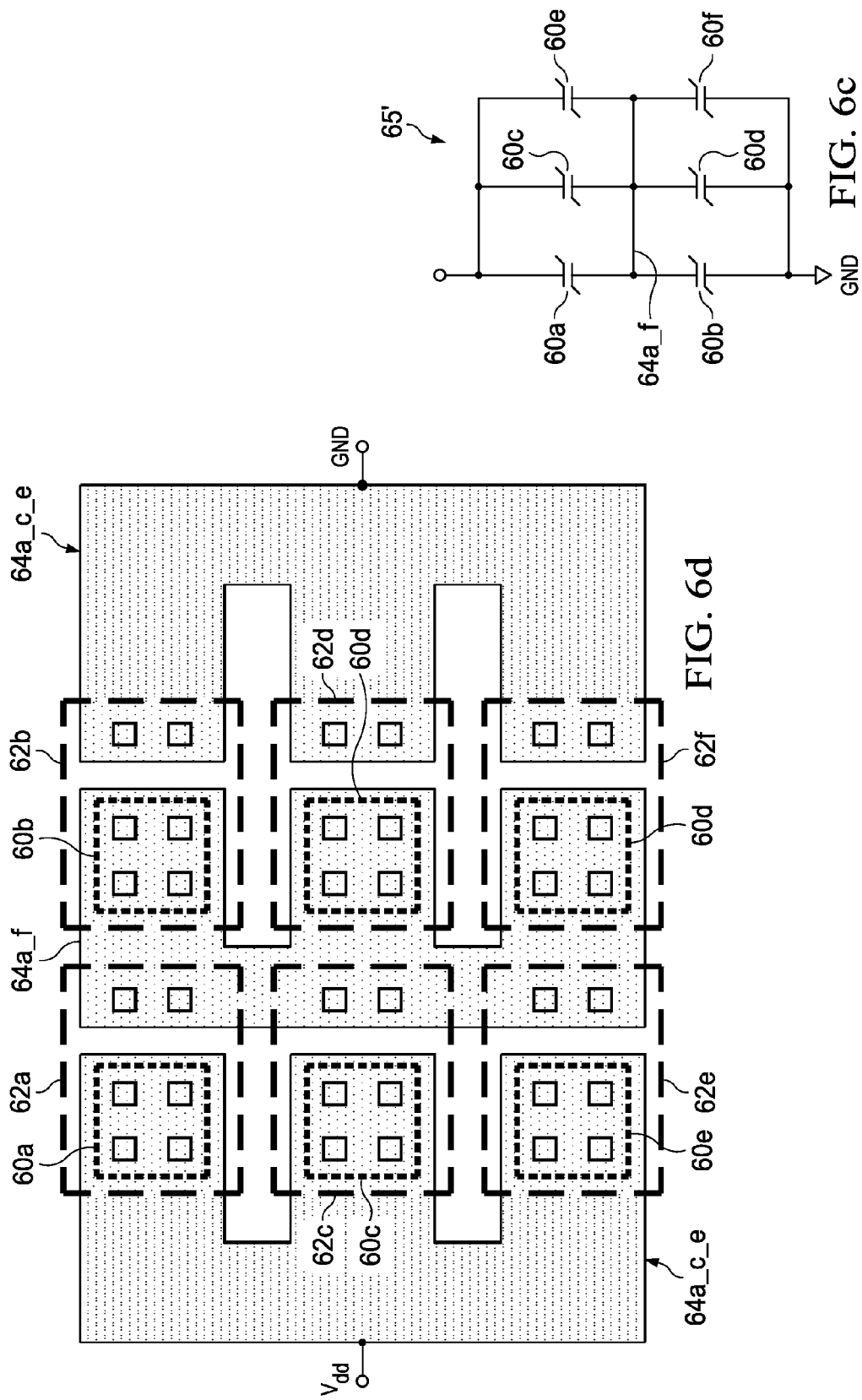

INTEGRATED CIRCUIT WITH INTEGRATED DECOUPLING CAPACITORS

CROSS-REFERENCE TO RELATED APPLICATIONS

This application claims priority, under 35 U.S.C. §119(e), of Provisional Application No. 61/532,446, filed Sep. 8, 2011, which is incorporated herein by reference.

STATEMENT REGARDING FEDERALLY SPONSORED RESEARCH OR DEVELOPMENT

Not applicable.

BACKGROUND OF THE INVENTION

This invention is in the field of integrated circuits. Embodiments of this invention are more specifically directed to the integration of large capacitance value capacitors, serving as decoupling capacitors, into the integrated circuit itself.

Decoupling capacitors are a staple component in modern electronic systems. As fundamental in the art, the current demanded by digital and analog functions in the electronic systems vary over time, with some variations being relatively large and sudden. Non-ideal power supplies cannot respond instantaneously to large and rapid changes in current demand, causing variations in the power supply voltage. These power supply voltage variations appearing at integrated circuit functions in the system are considered as noise. Because the operation of modern high performance integrated circuits is vulnerable to power supply noise, external decoupling capacitors are commonly implemented in electronic systems, for example connected between the power supply and ground terminals at each integrated circuit, to absorb this power supply voltage noise caused by varying current demand.

As known in the art, the effectiveness of decoupling capacitors improves with the proximity of the capacitors to the integrated circuit. Not only does a closely-placed capacitor provide the best decoupling effect, but parasitic inductance of conductors between the capacitors and the integrated circuit functions is minimized, such inductance contributing to the undesired noise. Tradeoffs between decoupling effectiveness (i.e., large capacitance values, close proximity) and the component and manufacturing cost.

Many modern electronic devices and systems now include substantial computational capability for controlling and managing a wide range of functions and useful applications. Many of these electronic devices and systems are now portable or handheld devices. For example, many mobile devices with significant computational capability are now available in the market, including modern mobile telephone handsets such as those commonly referred to as "smartphones", personal digital assistants (PDAs), mobile Internet devices, tablet-based personal computers, handheld scanners and data collectors, personal navigation devices, and the like. An important class of mobile devices are implantable medical devices, such as pacemakers, defibrillators, and the like. Many mobile devices, including implantable medical devices, now rely on solid-state memory not only for data storage during operation, but also as non-volatile memory for storing program instructions (e.g., firmware) and for storing the results and history of previous operations and calculations. Modern mobile devices typically include substantial non-volatile memory capacity, often amounting to as much as one or more gigabytes.

Ferroelectric random-access memory (FeRAM) is a popular non-volatile solid-state memory technology, particularly in implantable medical devices. A recently developed technology for realizing non-volatile solid-state memory devices involves the construction of capacitors in which the dielectric material is a polarizable ferroelectric material, such as lead zirconate titanate (PZT) or strontium-bismuth-tantalate (SBT). Hysteresis in the charge-vs.-voltage (Q-V) characteristic, based on the polarization state of the ferroelectric material, enables the non-volatile storage of binary states in those capacitors. In contrast, conventional MOS capacitors lose their stored charge on power-down of the device. It has been observed that ferroelectric capacitors can be constructed by processes that are largely compatible with modern CMOS integrated circuits, for example placing capacitors above the transistor level, between overlying levels of metal conductors.

Lead zirconate titanate (PZT) has become a prevalent ferroelectric dielectric material in FeRAM memory cells. As described in U.S. Pat. No. 6,656,748, commonly assigned herewith and incorporated hereinto by this reference, a preferred deposition technique for PZT when used as the capacitor dielectric in ferroelectric memory is metal organic chemical vapor deposition (MOCVD), especially for thin films (<100 nm). The MOCVD technique permits the film thickness to be scaled without significant degradation of switched polarization and coercive field, yielding PZT films with a low operating voltage and large polarization values. In addition, the reliability of the MOCVD PZT film has been observed to be better than that generally obtained using other deposition techniques, such as sputtering, particularly with respect to imprint/retention.

By way of further background, the integration of decoupling capacitors with PZT as the capacitor dielectric, into an integrated circuit that includes FeRAM memory cells using PZT as the ferroelectric material, is known in the art. It is known that ferroelectric materials such as PZT exhibit inherently high dielectric constants, and therefore capacitors using such materials as the capacitor dielectric provide a high capacitance per unit area. One example of such FeRAM memory integrated circuits uses sputtered PZT as the capacitor dielectric for both the ferroelectric memory cells and the decoupling capacitors.

BRIEF SUMMARY OF THE INVENTION

Embodiments of this invention provide integrated circuits into which both decoupling capacitors with ferroelectric material as the capacitor dielectric and ferroelectric memory cells using that same ferroelectric dielectric material as the storage medium are integrated.

Embodiments of this invention provide such integrated circuits in which the ferroelectric material is lead zirconium titanate (PZT) deposited by metal-organic chemical vapor deposition (MOCVD).

Embodiments of this invention provide such integrated circuits in which the decoupling capacitors have a relatively low propensity for dielectric breakdown.

Embodiments of this invention provide such integrated circuits in which one or more other capacitors can be constructed in parallel with the decoupling capacitors without requiring additional chip area.

Embodiments of this invention provide such integrated circuits in which ferroelectric capacitors using ferroelectric material as the capacitor dielectric are integrated, along with the ferroelectric memory cells, and in which those capacitors are used in connection with circuit applications such as voltage boost.

Other objects and advantages provided by embodiments of embodiments of this invention will be apparent to those of ordinary skill in the art having reference to the following specification together with its drawings.

An embodiment of this invention may be implemented into an integrated circuit including a ferroelectric memory, in which the memory cells include ferroelectric capacitors with MOCVD PZT as the ferroelectric material. The integrated circuit also includes a capacitor structure of first and second ferroelectric capacitors, each using MOCVD PZT as the capacitor dielectric. In a decoupling application, the first and second ferroelectric capacitors are connected in series between first and second power supply voltages (e.g., the second power supply voltage may be at ground). In some embodiments of the invention, the first and second ferroelectric capacitors have matching construction with one another, and carry voltage in the same polarity as one another. In an embodiment of the invention, a polysilicon-to-active capacitor is constructed under each of the first and second ferroelectric capacitors, and is connected in parallel with the series-connected first and second ferroelectric capacitors.

BRIEF DESCRIPTION OF THE SEVERAL VIEWS OF THE DRAWING

FIGS. 5a through 5f are plan views of a ferroelectric decoupling capacitor as shown in FIG. 3bs at various stages of the manufacturing process of FIG. 4, according to an embodiment of the invention.

FIGS. 6a and 6c are electrical diagrams, in schematic form of ferroelectric decoupling capacitors according to alternative embodiments of the invention.

FIGS. 6b and 6d are plan views, of the ferroelectric decoupling capacitors of FIGS. 6a and 6c, respectively, according to those alternative embodiments of the invention.

DETAILED DESCRIPTION OF THE INVENTION

This invention will be described in connection with one or more of its embodiments, namely as implemented into an integrated circuit including a ferroelectric memory cells, for example in an FeRAM array, because it is contemplated that the invention is particularly beneficial in such an application. However, it is contemplated that this invention can also provide important benefits and advantages in other applications. Accordingly, it is to be understood that the following description is provided by way of example only, and is not intended to limit the true scope of this invention as claimed.

This invention is suitable for use in connection with semiconductor memory circuits, whether serving as a stand-alone integrated circuit or as embedded into larger scale integrated circuits such as microprocessors, microcontrollers, or the so-called "system on a chip" (SoC) integrated circuits. This invention is also suitable for use in logic circuits, including combinational and sequential logic circuits, as well as programmable logic circuits, generally in which ferroelectric memory elements are also fabricated for use in configuration registers, analog trim elements, and the like. While examples of embodiments of this invention as used in an SoC including ferroelectric memory will be described in this specification, it is to be understood that this description is not to be interpreted in a limiting fashion.

Figure 1:
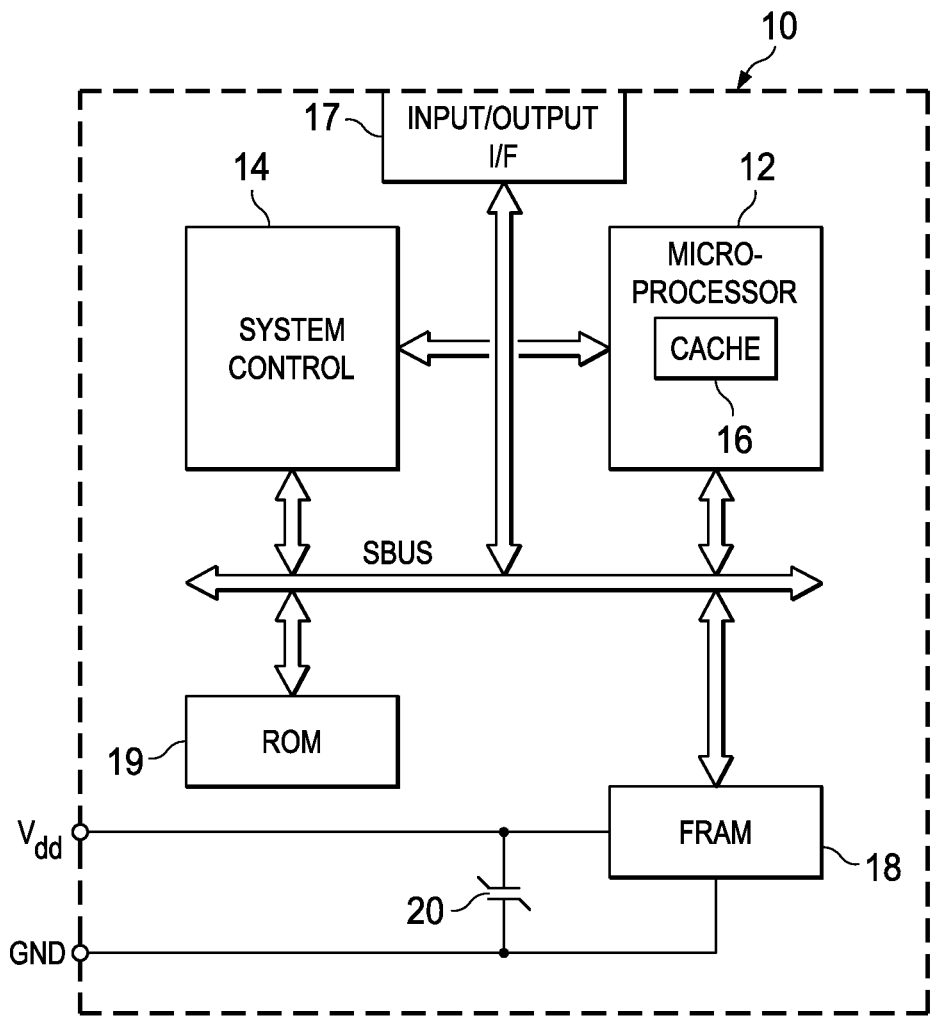
FIG. 1 is an electrical diagram, in block form, of a large scale integrated circuit incorporating a ferroelectric memory, constructed according to embodiments of the invention.

FIG. 1 illustrates an example of SoC large-scale integrated circuit 10, which is a single-chip integrated circuit into which an entire computer architecture is realized. As such, in this example, integrated circuit 10 includes a central processing unit of microprocessor 12, which is connected to system bus SBUS. Various memory resources, including ferroelectric random access memory (FRAM) 18 and read-only memory (ROM) 19, reside on system bus SBUS and are thus accessible to microprocessor 12. Typically, ROM 19 serves as program memory, storing the program instructions executable by microprocessor 12, while FRAM 18 serves as data memory; in some cases, program instructions may reside in FRAM 18 for recall and execution by microprocessor 12. Cache memory 16 (such as level 1, level 2, and level 3 caches, each typically implemented as static RAM) provides another memory resource, and resides within microprocessor 12 itself and therefore does not require bus access. Other system functions are shown, in a generic sense, in integrated circuit 10 by way of system control 14 and input/output interface 17.

Those skilled in the art having reference to this specification will recognize that integrated circuit 10 may include additional or alternative functions to those shown in FIG. 3, or may have its functions arranged according to a different architecture from that shown in FIG. 3. The architecture and functionality of integrated circuit 10 is thus provided only by way of example, and is not intended to limit the scope of this invention.

According to embodiments of this invention, one or more ferroelectric decoupling capacitors 20 are integrated within integrated circuit 10, for absorbing switching noise at various conductors within integrated circuit 10. As well-known in the art and as described above, switching noise commonly appears at power supply nodes of integrated circuit, due to the inability of non-ideal power supplies to instantaneously respond to sudden changes in current demand by the functions of the integrated circuit. In the example shown in FIG. 1, ferroelectric decoupling capacitor 20 is placed close to FRAM 18, and is connected between power supply node $V_{dd}$ and ground node GND. Of course, integrated decoupling capacitor 20 may alternatively be placed, or additional instances of decoupling capacitor may be placed, across power supply conductors near microprocessor 12, ROM 19, and other functions within integrated circuit 10. In some embodiments of the invention, decoupling capacitor 20 may be placed near the bond pads at which the power supply voltages and ground are received by integrated circuit 10, to provide one point of decoupling for all functions within integrated circuit 10.

According to embodiments of this invention, ferroelectric decoupling capacitors 20 are ferroelectric in the sense that the capacitor dielectric material of those capacitors are formed of a ferroelectric dielectric material, more so (or rather than) due to the ability of that material to become polarized in one of two states. Indeed, it is the "linear" capacitance of the ferroelectric material that provides the decoupling function according to embodiments of the invention, as opposed to the apparent capacitance as polarization charge is stored upon the change of polarization state of the material. But even without considering the polarization capacitance, the dielectric constant of conventional ferroelectric material is extremely high, enabling ferroelectric capacitors to provide a high capacitance per unit area. As will be described below, embodiments of this invention are suitable for use with lead zirconium titanate (PZT) deposited by metal-organic chemical vapor deposition (MOCVD) as the ferroelectric material, and thus the capacitor dielectric, of decoupling capacitors 20; PZT provides a dielectric constant that can range from about 500 to as high as 6000 (compared to dielectric constants of 3.9 for silicon dioxide, and from 6 to 8 for silicon nitride).

Figure 2A:
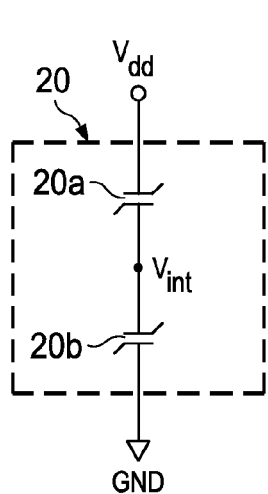
FIGS. 2a, 2c and 2d are electrical diagrams, in schematic form, of ferroelectric decoupling capacitors according to embodiments of the invention.

According to embodiments of this invention, each instance of decoupling capacitor 20 is realized by the series connection of two or more separate ferroelectric capacitor structures. FIG. 2a is an electric schematic of an example of decoupling capacitor 20, as consisting of two separate ferroelectric capacitors 20a, 20b connected in series between power supply node $V_{dd}$ and ground GND, similarly as in the implementation of FIG. 1. In this series realization, the voltage across each individual ferroelectric capacitor 20a, 20b is reduced from the full rail-to-rail voltage $V_{dd}$. For ferroelectric capacitors 20a, 20b presenting the same capacitance as one another, the intermediate node voltage $V_{int}$ is $V_{dd}/2$, with each of ferroelectric capacitors 20a, 20b supporting that voltage $V_{dd}/2$.

Figure 2B:
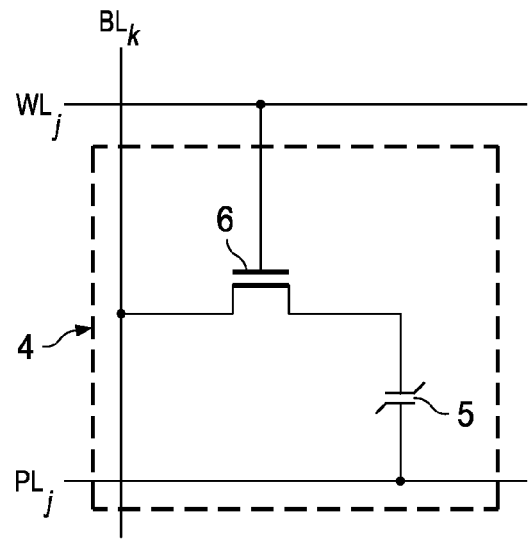
FIG. 2b is an electrical diagram, in schematic form, of a ferroelectric memory cell in the integrated circuit of FIG. 1 according to an embodiment of the invention.

FIG. 2b illustrates an example of the construction of 1-T, 1-C FRAM memory cell 4, for example as implemented within FRAM 18 of integrated circuit 10, and according to a construction now typically used in modern FRAMs. In this arrangement, ferroelectric capacitor 5 serves as the non-volatile memory element, and is constructed as a parallel-plate solid-state capacitor with ferroelectric dielectric material, such as MOCVD PZT, as the capacitor dielectric. In this example, FRAM cell 4 resides in row j and column k of an array of similarly constructed FRAM cells 4. One plate of capacitor 5 is connected to plate line $PL_j$ for the $j^{th}$ row of the array, and the other plate of capacitor 5 is connected to one end of the source/drain path of n-channel metal-oxide-semiconductor (MOS) transistor 6. The other end of the source/drain path of transistor 6 is connected to bit line $BL_k$ for the $k^{th}$ column of the array, and the gate of transistor 6 is connected to word line $WL_j$ of the $1^{th}$ row of the array. As such, transistor 6 serves as a pass transistor in the DRAM sense, connecting ferroelectric capacitor 5 to bit line $BL_k$ upon selection of row j according to a row address that indicates energizing of word line $WL_j$. The data storage mechanism of FRAM cells is the charge-voltage hysteresis of the ferroelectric capacitor dielectric. As known in the art, ferroelectric capacitors exhibit a difference in capacitance between its two polarized states, in response to the application of a polarizing voltage. If ferroelectric capacitor 5 is in the "−1" state, the application of a positive polarization voltage will change its state to the "+1" state, and the significant polarization charge that is stored as a result of the change of polarization state will appear as a relatively high capacitance. Conversely, if the ferroelectric capacitor 5 is already in its "+1" state, little polarization charge is stored as a result of the application of that voltage, and thus the apparent capacitance is relatively small. As such, the stored data state in FRAM cell 4 can be read by interrogating the capacitance of ferroelectric capacitors to discern its previous polarized state.

FRAM 18 of integrated circuit 10 may be realized by other types of ferroelectric memory cells. One such alternative construction is the use of static RAM cells (i.e., cross-coupled inverters), with a polarizable ferroelectric capacitor connected to each storage node. In this construction, the cross-coupled inverters can function as a conventional static RAM memory cell, with fast read and write times. A special "store" cycle operates to program the ferroelectric capacitors with the stored data state, allowing FRAM 18 to be powered down. On power up, the states of the ferroelectric capacitors set the initial state of the cross-coupled inverters, restoring the stored data to FRAM 18. It is contemplated that embodiments of this invention can be implemented in connection with each of these types of memory cells, as well as any type of ferroelectric memory cell or other ferroelectric component incorporated into integrated circuit 10.

As mentioned above, it has been observed that MOCVD PZT is a particularly attractive ferroelectric material for ferroelectric memory cells of various types, particularly in memory arrays such as within FRAM 18 of integrated circuit 10. MOCVD PZT is well suited for thin ferroelectric films (<100 nm), permitting low operating voltage and large polarization values. These thin MOCVD PZT films have been observed to be achieved without significant degradation of switched polarization and coercive field. In addition, the reliability of the MOCVD PZT film has been observed to be better than that generally obtained using other deposition techniques, such as sputtering, particularly with respect to imprint and retention.

However, MOCVD PZT results in a dielectric film that has a relatively rough surface, especially when compared against sputtered PZT and other sputtered ferroelectric materials. Because of this roughness, large capacitors (e.g., on the order of 0.1 mm$^2$) using MOCVD PZT film as the dielectric are prone to dielectric breakdown. Accordingly, it is contemplated that a single, direct, ferroelectric capacitor using MOCVD PZT of a size suitable for use as decoupling capacitor 20 will not be adequately reliable to withstand full rail-to-rail $V_{dd}$ power supply voltages, within modern reliability requirements.

According to embodiments of this invention, this shortcoming of large size MOCVD PZT capacitors is overcome by arranging the series connection of two or more ferroelectric capacitors 20a, 20b in each instance of decoupling capacitor 20, as shown in FIG. 2a. Because the voltage across each of ferroelectric capacitors 20a, 20b is reduced from the full $V_{dd}$ power supply voltage in this implementation, to nominally $V_{dd}/2$ for ferroelectric capacitors 20a, 20b of equal size, the vulnerability of ferroelectric capacitors 20a, 20b to dielectric breakdown is greatly reduced. It has been observed that this reduction in the applied voltage across each of the series-connected ferroelectric capacitors 20a, 20b enables the use of MOCVD PZT as the dielectric material, such that ferroelectric capacitors 20a, 20b can be simultaneously constructed, in the same manufacturing process flow, as ferroelectric capacitors 5 in memory cells 4 of FRAM 18.

Of course, the connection of capacitors in series necessarily results in reduced overall capacitance. The capacitance $C_s$ presented by the series connection of two capacitors $C_1, C_2$ is given by the fundamental relationship:

$$C_s = \frac{C_1 C_2}{C_1 + C_2}$$

As such, for the case in which capacitances $C_1$, $C_2$ are equal to one another ($C=C_1=C_2$), the series capacitance $C_s$ of the pair comes out to:

$$C_s = \frac{C^2}{2C} = \frac{C}{2}$$

or one-half that of one of the capacitors. Of course, the decoupling effect improves with capacitor size. As such, the series connection of ferroelectric capacitors 20a, 20b would be thought to be inefficient, because the capacitance provided by the chip area required to implement the two (or even more) ferroelectric capacitors 20a, 20b is greatly reduced by connecting them in series. As noted above, a single ferroelectric capacitor 20a would provide twice the capacitance in half the chip area, as compared with the series-connected pair of that capacitor 20a with its companion capacitor 20b.

However, it has been discovered, in connection with this invention, that the extremely high dielectric constant of PZT ferroelectric material is sufficient to tolerate this reduction in capacitance per unit area. In other words, while only half the nominal capacitance of a single ferroelectric capacitor 20a results from the series connection of the pair of ferroelectric capacitors 20a, 20b, even that reduced capacitance is sufficient for the decoupling task when implemented in modern integrated circuits, for example as shown in FIG. 1. In addition, because the series connection of ferroelectric capacitors 20a, 20b reduces the vulnerability of the dielectric film to breakdown, by reducing the applied voltages, MOCVD PZT can be used as the capacitor dielectric of these ferroelectric decoupling capacitors 20a, 20b, without adversely impacting the reliability of integrated circuit 10.

For example, series-connected ferroelectric capacitors 20a, 20b, each with an area of 0.1 mm² and using MOCVD PZT as the capacitor dielectric, have been observed to provide good decoupling performance, with expected reliability sufficient to meet modern reliability demands. Integrated decoupling capacitors 20 can thus be attained with relatively little impact on manufacturing cost beyond the chip area required.

Figure 2C:
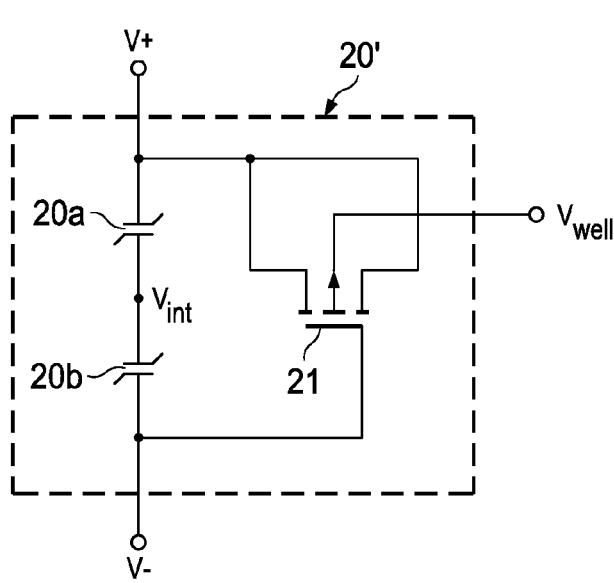

Instances of the series-connected ferroelectric capacitors 20a, 20b can be used for other circuit purposes within integrated circuit 10. FIG. 2c illustrates an example of such an implementation, by way of capacitor structure 20'. In this example, series-connected ferroelectric capacitors 20a, 20b are provided as in the case of decoupling capacitor 20. In addition, however, an additional capacitor is provided by way of metal-oxide-semiconductor (MOS) capacitor 21, which is connected in parallel with series-connected ferroelectric capacitors 20a, 20b between voltage nodes V+, V−. More specifically, MOS capacitor 21 is realized as a gate-to-active capacitor, with a capacitor dielectric formed of the MOS gate dielectric; in this example, the gate element of a p-channel MOS structure is connected to voltage V−, while the active element (i.e., source and drain regions in the MOS transistor sense) is connected to voltage V+. Capacitor structure 20' may include an additional external terminal, by way of the body node of MOS transistor 21, which applies a bias to the channel region underlying its gate element as applied at node $V_{well}$. For example, in a single or twin-well CMOS structure, this body node voltage is applied by way of a well bias (e.g., to the n-type well within which p-channel MOS transistors are realized). Capacitor structure 20' of FIG. 2c is useful as a "boost" or "bootstrap" capacitor within the functional circuitry of integrated circuit 10. For example, some memory architectures utilize a "boosted" voltage (i.e., above power supply voltage $V_{dd}$) on word lines such as word line $WL_j$ in memory cell 4, to enable the transfer of charge across pass transistor 6 without a diode voltage drop. Other functions utilizing "boosted" voltages include charge pump circuits and the like.

Figure 3A:
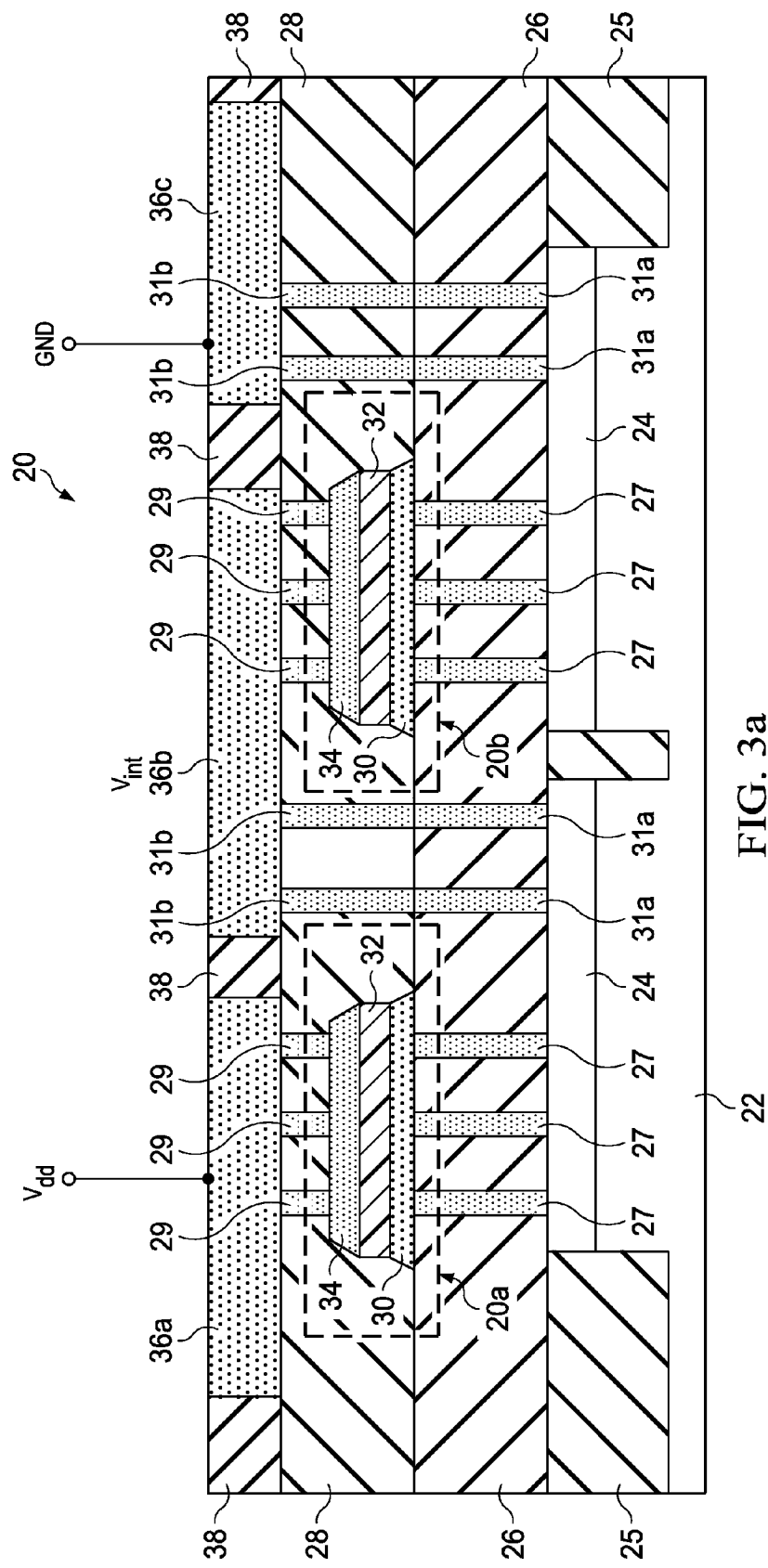
FIGS. 3a and 3b are cross-sectional views of integrated circuit structures including ferroelectric decoupling capacitors according to embodiments of the invention.

Referring now to FIG. 3a, an example of the construction decoupling capacitor 20 according to an embodiment of the invention will now be described, by way of a cross-sectional view of that structure. In this example, decoupling capacitor 20 is fabricated at the surface of p-type silicon substrate 22; of course, other substrate materials, including n-type silicon, a silicon-on-insulator film, other semiconductors, and the like may alternatively be used. Active regions are defined at the surface of substrate 22 by isolation dielectric structures 25. In this example, isolation dielectric structures 25 are formed as shallow trench isolation ("STI") structures of deposited silicon dioxide, but of course other isolation techniques, such as local oxidation of silicon (LOCOS) may be implemented. In this region of the integrated circuit structure at which decoupling capacitor 20 is formed, active regions 24 are heavily-doped n-type, to serve as interconnections within decoupling capacitor 20 as will be described below.

Ferroelectric capacitors 20a, 20b overlie respective active regions 24, separated therefrom by interlevel dielectric 26. Each of ferroelectric capacitors 20a, 20b include bottom plate 30, ferroelectric material 32, and top plate 34. Bottom and top plates 30, 34 are formed of a conductive material, such as a metal, that is compatible for interfacing and contacting ferroelectric material 32. Examples of the material of bottom and top plates 30, 34 include platinum, tungsten, and other metals, and alloys of those metals, as known in the art for construction of ferroelectric capacitors. Ferroelectric material 32 may be any conventional ferroelectric material such as PZT, BST, and the like. However, it is contemplated that embodiments of this invention may be used even with rough ferroelectric films, such as PZT formed by MOCVD. As described above, MOCVD PZT is an attractive ferroelectric film for ferroelectric memory cells, but heretofore has not been well-suited for large direct capacitors. But because ferroelectric capacitors 20a, 20b according to embodiments of this invention may be reliably implemented as decoupling capacitor 20 using thin films (<100 nm) of MOCVD PZT as the dielectric film, ferroelectric capacitors 20a, 20b can be constructed similarly to and simultaneously with the ferroelectric capacitors in memory cells in the same integrated circuit.

Second interlevel dielectric 28 overlies ferroelectric capacitors 20a, 20b and interlevel dielectric 26, as shown in FIG. 3a. Metal conductors 36a, 36b, 36c are disposed above second interlevel dielectric 28, with a dielectric film 38 insulating metal conductors 36a, 36b, 36c from one another at that upper level. Of course, additional metal conductor levels may be provided above metal conductors 36a, 36b, 36c, depending on the complexity of the integrated circuit and its construction.

In this example, metal posts 27 are disposed through contact openings in interlevel dielectric 26, to provide electrically-conductive contact between bottom plates 30 of ferroelectric capacitors 20a, 20b and active regions 24, in the conventional manner. Vias (i.e., metal-to-metal contact openings through a dielectric) are etched through second interlevel dielectric 28, into which metal posts 29 are disposed, for making electrically-conductive contact between metal conductors 36 and top plates 34 of ferroelectric capacitors 20a, 20b. In addition, stacked vias and contact openings are etched through both interlevel dielectric layers 26, 28, into which metal post lower portions 31a and metal post upper portions 31b are disposed for making electrically-conductive contact between metal conductors 36a, 36b, 26c and active regions 24.

In this arrangement, metal conductor 36a overlying ferroelectric capacitor 20a is connected to power supply voltage $V_{dd}$, and as such communicates this voltage to top plate 34 of ferroelectric capacitor 20a via metal conductors 29. Via metal posts 31, metal conductor 36b makes contact to the instance of active region 24 to which bottom plate 36 of ferroelectric capacitor 20a makes contact. Metal conductor 36b is also connected to top plate 34 of ferroelectric capacitor 20b, via metal posts 29. In this way, top plate 34 of ferroelectric capacitor 20b is in electrical contact with bottom plate 30 of ferroelectric capacitor 20a, at node $V_{int}$. Metal conductor 36c, which is connected to ground node GND in this example, is connected by way of metal posts 31b, 31a to active region 24 to which bottom plate 30 of ferroelectric capacitor 20b is in contact, via metal conductors 27.

Alternatively, the interconnection between bottom plate 30 of ferroelectric capacitor 20a and top plate 34 of ferroelectric capacitor 20b, and also the interconnection between bottom plate 30 of ferroelectric capacitor 20b and metal conductor 36c, may be made by way of a polycrystalline silicon element disposed under ferroelectric capacitors 20a, 20b, respectively, instead of active regions 24. This polysilicon element may be disposed over isolation dielectric structures 25 at those locations, to minimize stray capacitance and vulnerability to leakage.

Referring back to the schematic diagram of FIG. 2a, the voltage at node $V_{int}$ of course depends on the relative capacitances of ferroelectric capacitors 20a, 20b. As mentioned above, particularly for the case of MOCVD PZT for which dielectric breakdown is of concern, best reliability is achieved by keeping the maximum voltage across either of ferroelectric capacitors 20a, 20b as low as possible. For capacitors in series, this is accomplished by keeping the voltages across each capacitor as close to one another as possible. In embodiments of this invention, this is accomplished by constructing ferroelectric capacitors 20a, 20b to have capacitances that are as equal to one another as can be practicably attained; such relative capacitance characteristics are also critical for dynamic transitions of the circuit. To best accomplish this, certain structural aspects of the series capacitors should be matched as closely as possible. Some of the key variables in this regard are the size and shape of the capacitors, and the number and placement of the electrical connections on the top and bottom plates of the ferroelectric capacitors. Other variables may also be important, including control of the layout of the ferroelectric and/or electrical connections near the capacitor component. As will be described in further detail below, ferroelectric capacitors 20a, 20b of embodiments of the invention are constructed in a matched fashion, so that those electrical characteristics that are dependent on the construction of capacitors 20a, 20b are matched as closely as possible.

In addition, the leakage current of the capacitors in series is important for longer term voltage applications (ranging from seconds to hours), such as applicable to FeRAM applications. If the leakage of one of the series capacitors is larger than that of the others, the internal voltages among the capacitors will drift, causing the majority of the voltage drop to be across one capacitor (the less leaky capacitor). By using a wiring approach that applies the same voltage polarity across all of the series capacitors, the internal leakage of the various capacitors will be similar, which helps maintain the voltages across the various capacitors as similar as possible over time. This is accomplished in the arrangement of FIG. 3a by routing the voltage at bottom plate 30 of ferroelectric capacitor 20a (node $V_{int}$) to top plate 34 of ferroelectric capacitor 20b, via metal conductor 36b as shown.

Figure 3B:
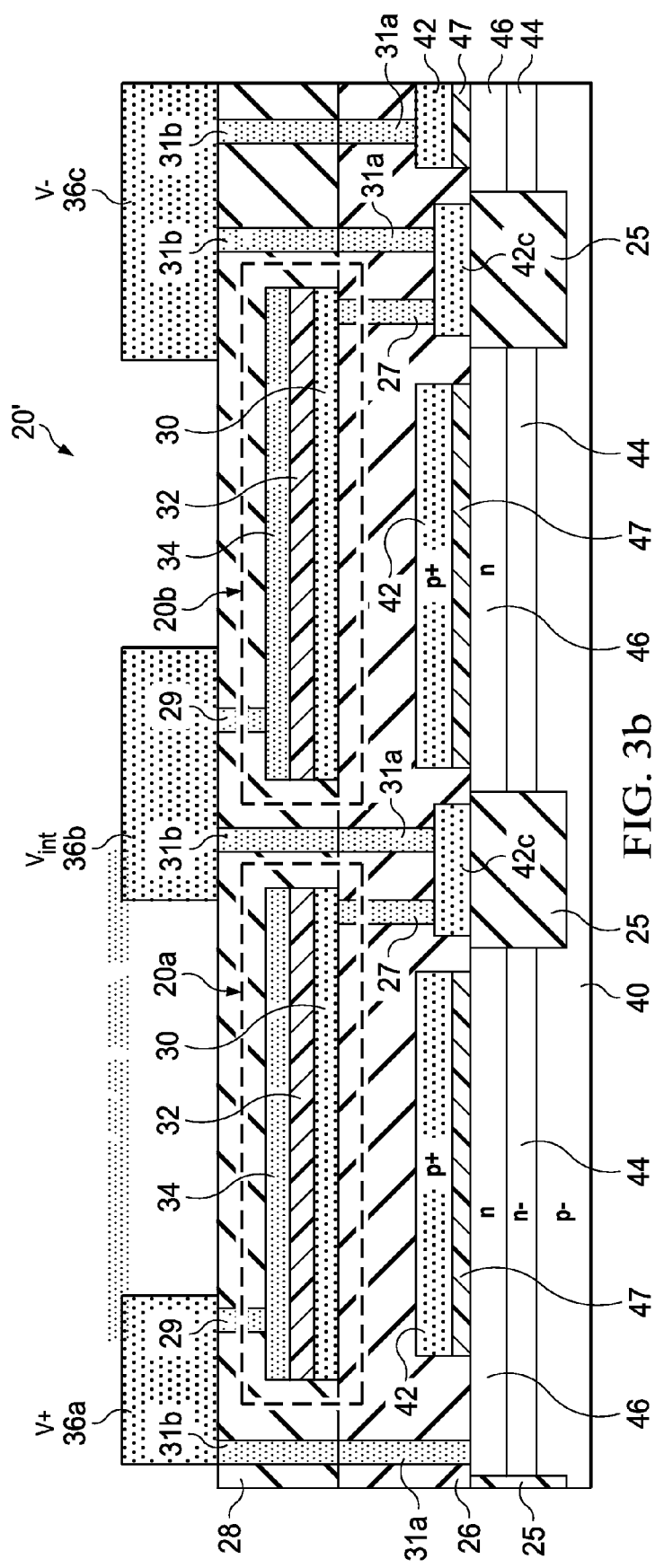

FIG. 3b illustrates, in cross-section, capacitor structure 20' of FIG. 2c according to an embodiment of the invention, in which series-connected ferroelectric capacitors 20a, 20b are in parallel with a polysilicon-to-active capacitor between voltage nodes V+, V−. Of course, this parallel capacitor structure 20' can alternatively be used as a decoupling capacitor between power supply nodes (e.g., between power supply voltage $V_{dd}$ and ground). In the implementation of this embodiment of the invention shown in FIG. 3b, ferroelectric capacitors 20a, 20b are disposed above substrate 40, which in this case is lightly-doped p-type silicon, at which isolation dielectric structures 25 have been formed, for example by way of STI silicon dioxide structures. Ferroelectric capacitors 20a, 20b are constructed in similar fashion as described above in connection with decoupling capacitor 20 of FIG. 3a.

N-well 44 is within the active regions between isolation dielectric structure 25, in the location of capacitor structure 20', with n-type region 46 of slightly higher dopant concentration formed at the surface of n-wells 44, underlying ferroelectric capacitors 20a, 20b in this location of the integrated circuit. N-type region 46, in this example, obtains its higher dopant concentration from an n-type (arsenic or phosphorous) threshold voltage adjust implant that is applied to those locations of n-wells 44 in integrated circuit 10 at which p-channel MOS transistors are to be formed. As such, n-type region 46 in this embodiment of the invention is constructed similarly as the channel regions of p-channel MOS transistors formed elsewhere in integrated circuit 10. The portions of n-well 44 shown in FIG. 3b (i.e., the separate portions of these structures underlying ferroelectric capacitors 20a, 20b) are contiguous with one another, and the portions of overlying n-type region 46 are similarly contiguous with one another. Contiguous polycrystalline silicon element 42 overlies portions of n-type regions 46, under bottom plates 30 of ferroelectric capacitors 20a, 20b (separated therefrom by inter-level dielectric 26), with gate dielectric 47 disposed between polysilicon element 42 and n-type region 46. Polysilicon element 42 at this location is doped p-type, and as such may be formed by photolithography at the same time as gate structures for MOS transistors in the integrated (and doped p-type at the same time as the gate elements for p-channel MOS transistors), if desired. Field polysilicon elements 42c, overlying isolation dielectric structures 25, are formed from the same layer of polycrystalline silicon as polysilicon element 42, but are not contiguous with polysilicon element 42.

The contiguous portions of n-well 44, and of overlying n-type region 46, are maintained at the same electrical potential in this portion of the integrated circuit, specifically at the common electrical potential V+ applied by stacked metal post portions 31b, 31a extending from metal conductor 36a. Contiguous polysilicon element 42 is held at a common potential V− by way of stacked metal post portions 31b, 31a extending from metal element 36c to make electrically-conductive contact to polysilicon element 42. Accordingly, polysilicon element 42 and n-type region 46 (with n-well 44) form a poly-to-active capacitor, with gate dielectric 47 as the capacitor dielectric, with a voltage corresponding to the difference between the voltages at nodes V+ and V−. Field poly elements 42c serve as interconnections to bottom plates 30 of ferroelectric capacitors 20a, 20b, with bottom plate 30 of ferroelectric capacitor 20a connected via field poly element 42c and metal posts 27, 31 to metal conductor 36b at node $V_{int}$, and bottom plate 30 of ferroelectric capacitor 20b connected via field poly element 42c and metal posts 27, 31 to metal conductor 36c, at node V−.

According to the construction shown in FIG. 3b, poly-to-active capacitor 21 (FIG. 2c) can readily be fabricated in parallel with series-connected ferroelectric capacitors 20a, 20b, without requiring additional chip area and without requiring a substantial increase in processing complexity. The circuit applications of capacitor structure 20' are expanded from the decoupling function, and suitable for use in "boost" circuits, charge pumps, and the like.

As in the case of decoupling capacitor 20 shown in FIG. 3a, the reliability of capacitor structure 20' is optimized by constructing ferroelectric capacitors 20a, 20b to have capacitances that are as equal to one another as can be practicably attained, especially if MOCVD PZT serves as capacitor dielectric 32. This optimization is best attained by constructing ferroelectric capacitors 20a, 20b to be matched as closely as possible, and with the polarity of the applied voltage being the same at both ferroelectric capacitors 20a, 20b.

Other alternative arrangements of underlying parallel capacitor 21 are contemplated according to this invention. For example, poly-to-active capacitor 21 may alternatively be constructed with n-type polysilicon. However, it has been observed that this arrangement of capacitor 21 may exhibit higher leakage than its counterpart described above having a p-type polysilicon element 42. Further in the alternative, the active region of poly-to-active capacitor 21 may be constructed similarly as the channel region of an n-channel MOS transistor. In a twin-well arrangement according to this alternative, a p-type well would be formed within n-well 44, with a slightly more heavily-doped p-type portion formed in the p-well by the threshold voltage adjust implant for n-channel MOS transistors; p-type polysilicon element 42 would form the polysilicon plate as before. Further in the alternative to the structure of FIG. 3b, a p+ active region 46 may be formed within n-well 44 to serve as the active lower plate of capacitor 21, with p-type polysilicon element 42 forming the polysilicon plate as before. Those skilled in the art having reference to this specification will recognize these and other alternative arrangements, which are contemplated to be within the scope of this invention.

Conventional manufacturing process flows for ferroelectric integrated circuits may be used to fabricating decoupling capacitor 20 and capacitor structure 20' according to embodiments of the invention. Examples of such manufacturing process flows are described in commonly assigned U.S. Pat. No. 6,830,938 B1, issued Dec. 14, 2004; Summerfelt et al., "Embedded Ferroelectric Memory Using a 130-nm 5 Metal Layer Cu/FSG Logic Process", 2004 *Non-Volatile Memory Technology Symposium* (IEEE), pp. 153-54; and Jung et al., "Key Integration Technologies for Nanoscale FRAMs", *Trans. Ultrasonics, Ferroelectrics, and Frequency Control*, Vol. 54, No. 12 (IEEE, December 2007), pp. 2535-40, all incorporated herein by this reference.

Referring now to FIGS. 4 and 5a through 5f, an example of the construction of matched ferroelectric capacitors 20a, 20b within the context of the construction of capacitor structure 20' of FIGS. 2b and 3b, and according to an embodiment of the invention, will now be described. While the full extent of layout matching of ferroelectric capacitors 20a, 20b, as will now be described, need not necessarily be implemented according to this invention, it is contemplated that such matching between ferroelectric capacitors 20a, 20b best ensures that intermediate voltage $V_{int}$ is at the midpoint of the voltage applied across the structure, and thus best ensures ferroelectric material reliability. To the extent that ferroelectric capacitors 20a, 20b do not match one another in construction, the possibility for uneven distribution of the applied voltage, and thus higher voltage at one or the other of ferroelectric capacitors 20a, 20b, is increased. It is of course contemplated that other structures in that integrated circuit 10 will be simultaneously formed by the processes in this manufacturing flow, such structures including transistors, ferroelectric capacitors for FeRAM memory cells, interconnections among those structures, and the like. It is contemplated that those skilled in the art having reference to this specification will readily comprehend the incorporation and fabrication of such other structures in the same integrated circuit as capacitor structure 20', without undue experimentation. This description will refer to the cross-sectional diagram of FIG. 3b, by way of example.

Figure 4:
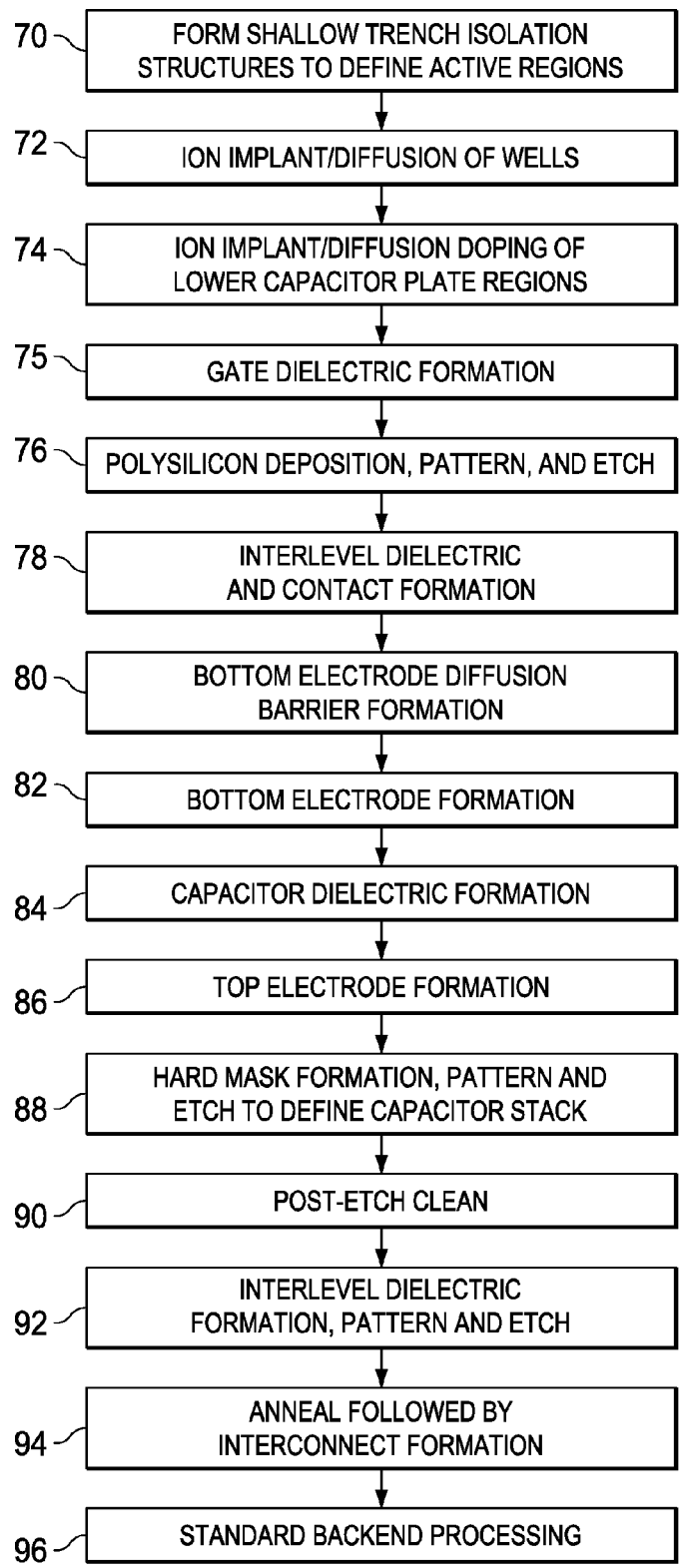
FIG. 4 is a flow diagram illustrating the manufacturing process for fabricating ferroelectric decoupling capacitors according to embodiments of the invention.

The example of the process shown in FIG. 4 begins with the formation of shallow trench isolation structures 25, in process 70. As known in the art, process 70 includes such operations as the formation and patterning of a hard mask layer to protect the eventual active regions (i.e., at which isolation dielectric structures 25 are not to be formed) in substrate 40. For the case of isolation dielectric structures 25 formed as shallow trench isolation structures, process 70 further includes the etching of trenches into substrate 42, and the filling of those trenches with an insulating material, such as CVD silicon dioxide. Chemical mechanical polishing of the surface of the structure, so that the top surfaces of isolation dielectric structures 25 are generally flush with the semiconducting surface of substrate 40. In process 72, certain portions of the active surface of substrate 40, including the active region at the location of capacitor structure 20' in this embodiment of the invention, receive dopant for the formation of n-type wells 44. Typically, well formation process 72 will include the masking of those regions not to receive the n-type well implant, followed by ion implantation of the dopant species and an anneal to diffuse the implanted dopant to the desired profile. In twin-well processes, p-type wells may be formed elsewhere in the integrated circuit at this point in the process.

Figure 5A:
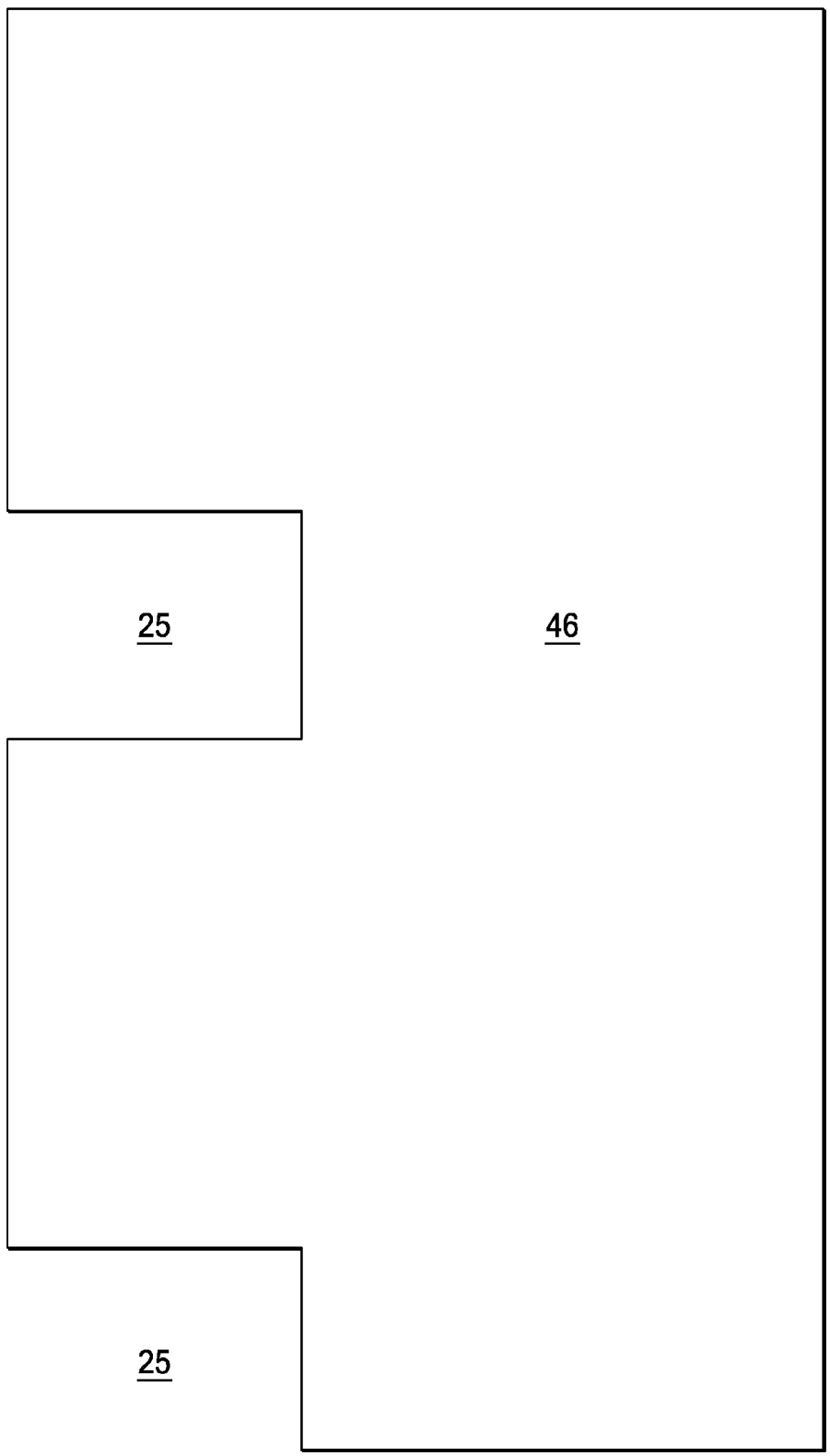

In process 74, according to this embodiment of the invention, p+ regions 44 are then formed within n-type well 44, for example by ion implantation of p-type dopant followed by an anneal. Process 74 may not necessarily serve as the source/drain implant of p-channel MOS transistors within integrated circuit 10, since the gate structures have not yet been formed (and thus self-aligned source/drain implant is not yet possible at this stage of the process). FIG. 5a illustrates, in plan view, the portion of integrated circuit 10 at which active regions are defined by isolation dielectric structures 25 following process 74. As shown in FIG. 5a, p+ active region 46 is disposed at the location of capacitor structure 20', surrounded by isolation dielectric structures 25. In capacitor structure 20' according to this embodiment of the invention, this p+ region 46 serves as the lower plate of poly-to-active capacitor 21. Gate dielectric 47 is formed over p+ region 46 and elsewhere in process 75, which may be performed by thermal oxidation, dielectric deposition, or a combination of the two. Of course, this process 75 also typically forms the gate dielectric film for MOS transistors in integrated circuit 10.

Figure 5B:
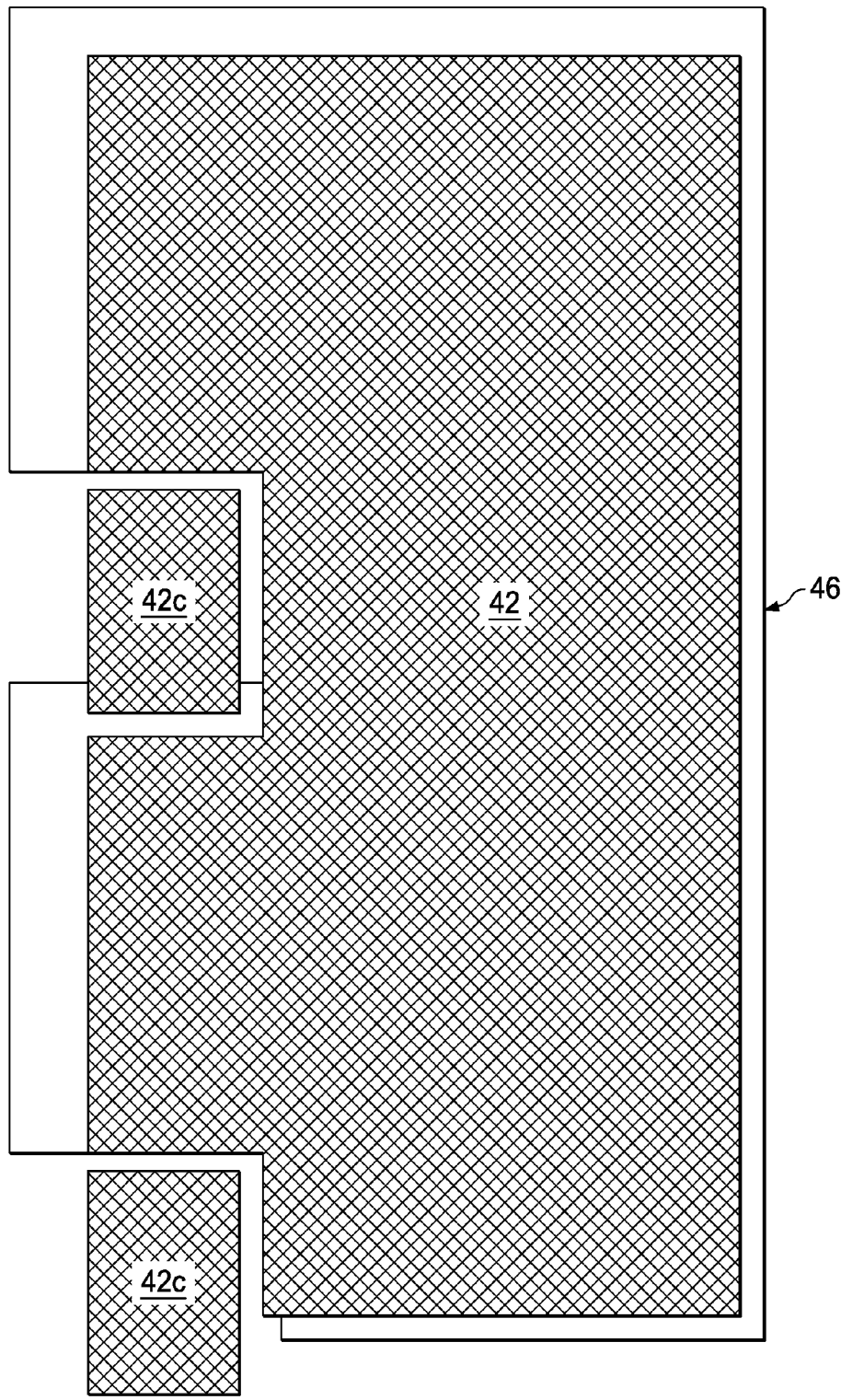

In process 76, polysilicon element 42 and field poly elements 42c are then formed, by deposition, photolithographic patterning, and polysilicon etch, in the conventional manner. It is contemplated that gate elements of transistors and other structures elsewhere in integrated circuit 10 are simultaneously formed in this process 76, in the conventional manner. As described above, polysilicon element 42 and field poly elements 42c are p-type doped at the location capacitor structure 20', either in situ during deposition or by a subsequent ion implant. FIG. 5b is a plan view of capacitor structure 20' following process 76. As evident from FIG. 5b, and as described above, polysilicon element 42 is a contiguous structure overlying much of p+ active region 46, and will serve as the top plate of poly-to-active capacitor 21, as described above. Field poly elements 42c are generally disposed over isolation dielectric structures 25, and as such largely do not overlie p+ region 46.

Figure 5C:
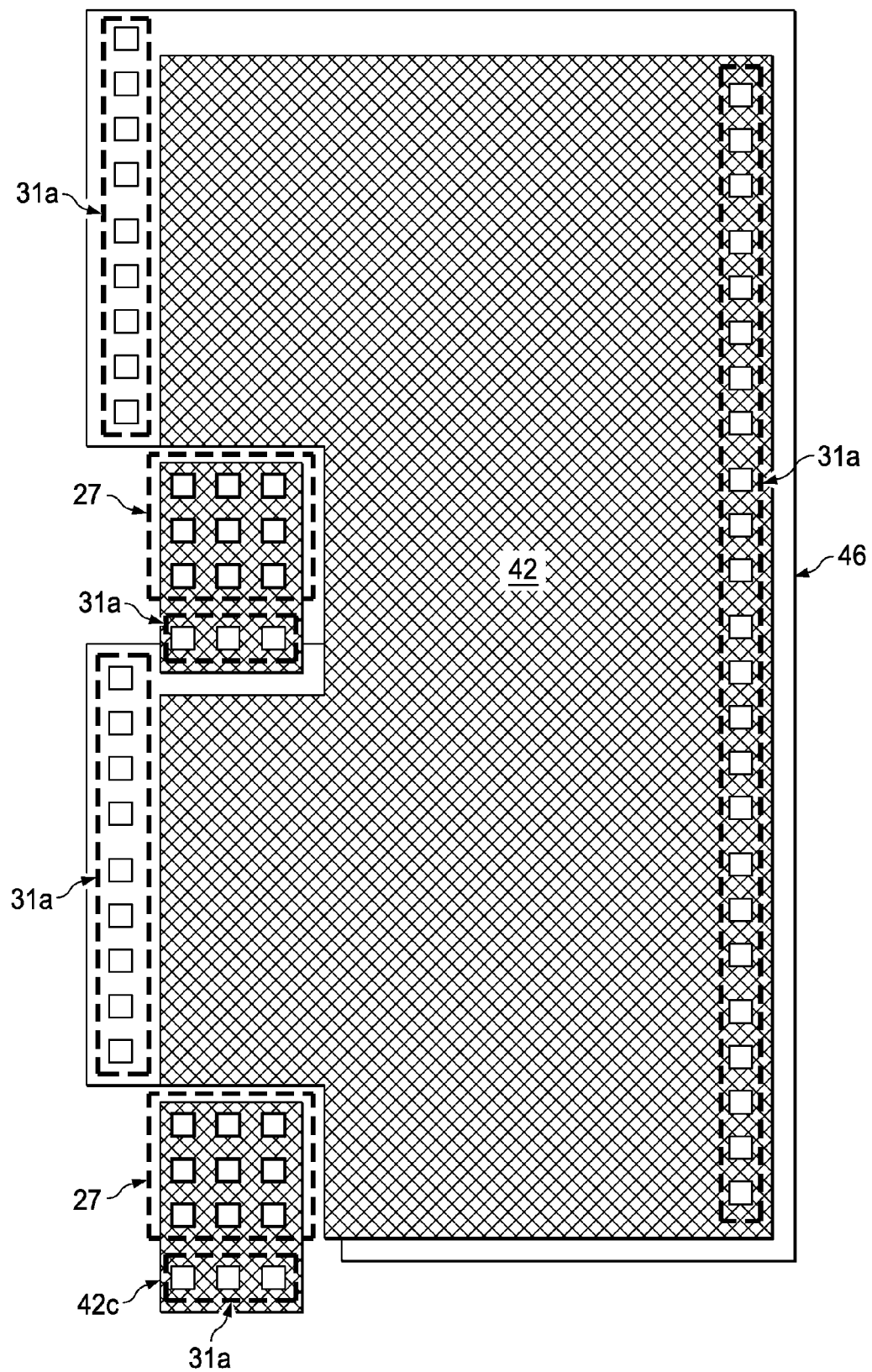

In process 78, interlevel dielectric layer 26 is formed over the structure, including polysilicon element 42 and field poly elements 42c. Contact openings are formed through that interlevel dielectric 26, and metal posts 27 (e.g., of tungsten) are deposited into those contact openings, generally over a barrier layer (e.g., TiN) to avoid oxidation. Metal post lower portions 31a may also be formed of this material into contact openings at this time. FIG. 5c illustrates the structure, in plan view, after process 78, with the locations of conductor posts 27, 31a extending to p+ region, polysilicon element 42, and field poly elements 42c, generally indicated.

Ferroelectric capacitors, including capacitors 20a, 20b, are then formed over interlayer dielectric 26. In process 80, a bottom electrode diffusion barrier layer is formed over interlevel dielectric 26 and conductor posts 27, 31a. This bottom electrode diffusion layer is a low resistivity material, such as TiAlON, TaSiN, TiSiN, TaAlN, Ti, TiN, Ta, TaN, HfN, ZrN, HfAlN, CrN, TaAlN, CrAlN, and the like, and may be sputtered or deposited by CVD as desired. In process 82, bottom plate 30 is formed over this bottom electrode diffusion barrier layer, from a conductive material with low contact resistance. Suitable materials for bottom plate 30 include Pt, Pd, PdOx, IrPt alloys, Au, Ru, $RuO_x$, $(Ba,Sr,Pb)RuO_3$, $(Sr,Ba,Pb)IrO_3$, Rh, $RhO_x$, $LaSrCoO_3$, $(Ba,Sr)RuO_3$, $LaNiO_3$, formed by sputtering, for example. This bottom plate 30 layer is formed overall, and is not patterned and etched at this point.

Capacitor dielectric 32 of a ferroelectric material is then formed on bottom plate 30 layer, in process 84. As described above, it is contemplated that capacitor dielectric 32 is PZT (lead zirconate titanate), deposited by metal organic chemical vapor deposition (MOCVD). This PZT layer may be doped, alloyed with $SrTiO_3$, $BaTiO_3$, $CaTiO_3$, or another suitable material, doped and alloyed, or neither. Other materials, such as strontium bismuth tantalate (SBT) and other layered perovskites such as strontium bismuth niobate tantalate (SBNT) or bismuth titanate, $BaTiO_3$, $PbTiO_3$, $Bi_2 TiO_3$, etc., may alternatively be used. As mentioned above, MOCVD PZT is a particularly attractive material for FeRAM applications, despite its rough topography, due to its high polarization, low processing temperature, and capability of being formed as thin films (<100 nm) without significant degradation of switched polarization and coercive field. In addition, the reliability of MOCVD PZT film is better than that generally obtained using other deposition techniques, particularly with respect to imprint/retention. Capacitor dielectric 32 is formed over the surface of the structure, and is not patterned and etched at this point.

In process 86, top plate 34 layer is formed over ferroelectric dielectric material 32. Top plate 34 can be comprised of one or more individual layers of similar to those employed for bottom plate 30, including iridium oxide and iridium. In many applications involving lead-based ferroelectrics such as PZT, a conductive oxide top plate 34 material such as $IrO_x$, $RuO_x$, $RhO_x$, $PdO_x$, $PtO_x$, $AgO_x$, $(Ba,Sr)RuO_3$, $LaSrCoO_3$, $LaNiO_3$, $YBa_2 Cu_3 O_{7-x}$ is preferred over noble metals, to minimize fatigue. If such an oxide film is used, a noble metal layer may form a top portion of top plate 34, to provide low contact resistance. Top plate 34 can be formed via a variety of suitable deposition processes, such as a physical vapor deposition process.

Figure 5D:
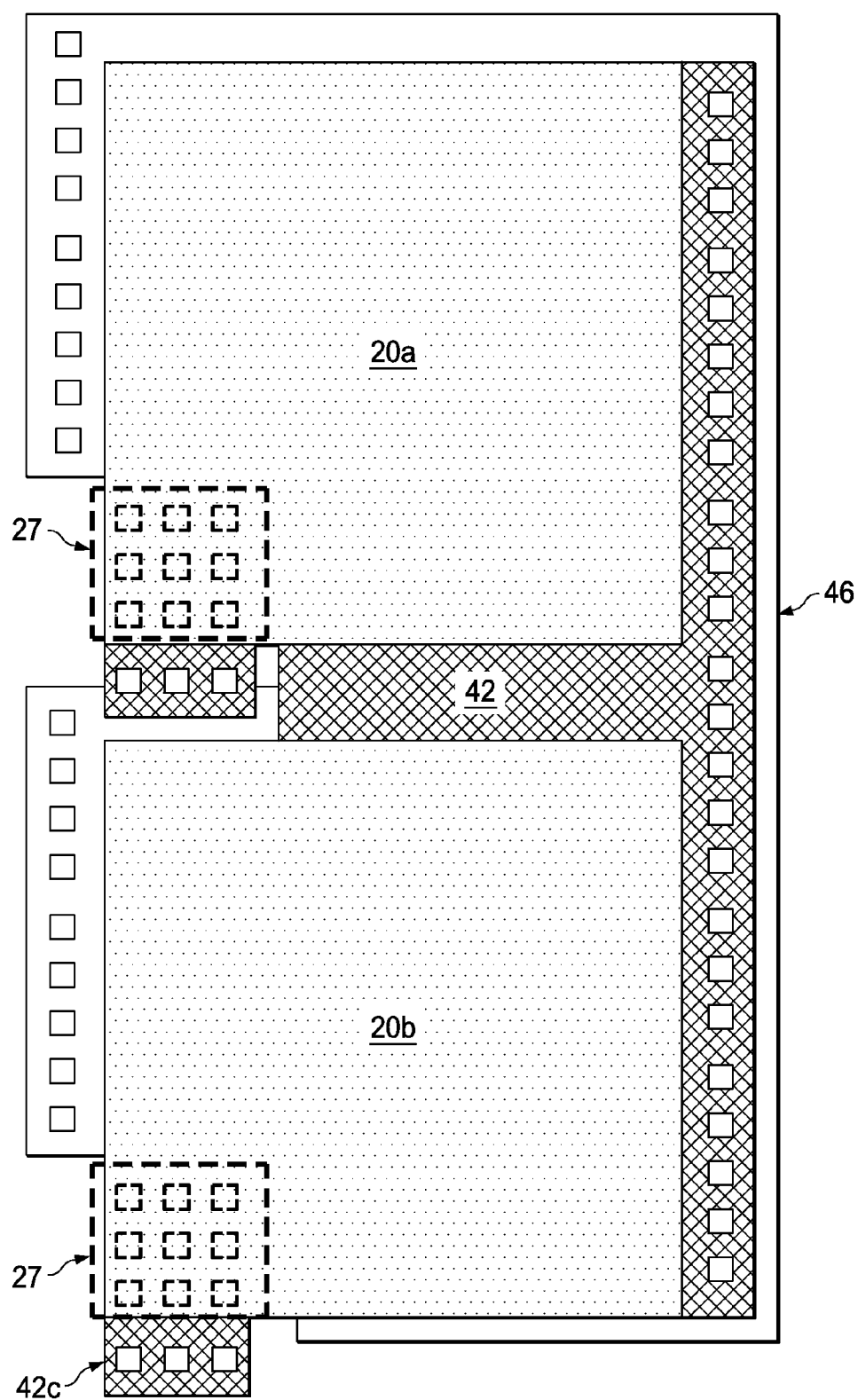

In process 88, the ferroelectric stack of bottom plate 30, ferroelectric capacitor dielectric 32, and top plate 34 is patterned and etched. Typically, a hard mask formed of an etch-resistant material, is deposited and photolithographically patterned, to define the ferroelectric capacitors 20a, 20b. Once the hard mask is in place, then the stack of layers including top plate 34, capacitor dielectric 32, and bottom plate 30 are etched to form ferroelectric capacitors 20a, 20b, and such other ferroelectric capacitors as desired elsewhere in integrated circuit 10. FIG. 5d is a plan view of the portion of integrated circuit 10 following process 88, with ferroelectric capacitors 20a, 20b (top plate 30 being the only visible element in this view) defined in their desired locations. Conductor posts 27 are illustrated, as dashed lines, by way of reference, but of course would underlie ferroelectric capacitors 20a, 20b and would not necessarily be visible on the physical structure in this view at this point in the process.

As mentioned above, it is desirable to match the construction of ferroelectric capacitors 20a, 20b to one another as closely as possible, to ensure that the voltage between terminals V+ and V− (e.g., power supply voltage $V_{dd}$ to ground GND) is as evenly split as possible, thus minimizing the maximum voltage across either capacitor. This matching is illustrated in FIG. 5d by ferroelectric capacitors 20a, 20b matching one another in size, orientation at the surface of integrated circuit 10, position of contacts and metal post 27 locations, and shape and size of underlying structures (e.g., polysilicon element 42).

Referring back to FIG. 4, post-etch clean process 90 is then performed to remove unwanted remnants of the patterning process (e.g., developer, resist, and the like), for example as described in the above-incorporated U.S. Pat. No. 6,830,938. In process 92, interlevel dielectric 28 (FIGS. 3a and 3b) is deposited or otherwise formed over the structure. Interlevel dielectric 28 may be formed of any appropriate dielectric material, such as $SiO_2$, FSG, PSG, BPSG, PETEOS, HDP oxide, a silicon nitride, silicon oxynitride, silicon carbide, silicon carbo-oxy-nitride, a low dielectric constant material, or a combination or stack of these materials. Interlevel dielectric 28 is planarized, for example by chemical mechanical planarization, following its deposition. Also in process 92, vias are etched through interlevel dielectric 28, by standard pattern and etch processing, so that electrical connection may be made from overlying metal conductors to be formed.

Figure 5E:
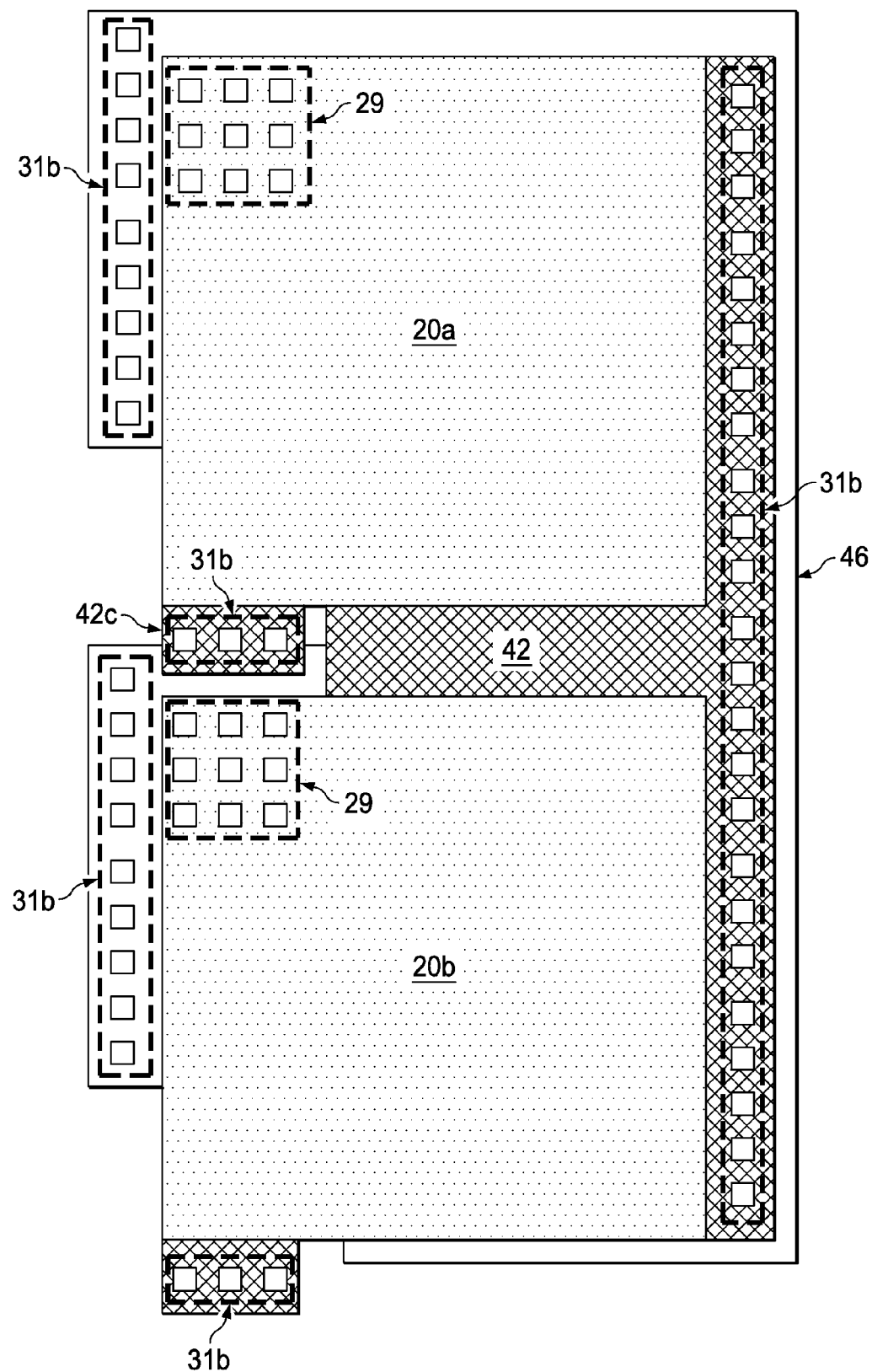

Anneal process 94 is then performed to remove damage to capacitor dielectric 28 introduced by the capacitor stack processing and to improve electrical properties. Also in process 84, interconnects to the elements of ferroelectric capacitors 20a, 20b are also formed. These metal interconnects include the formation of metal posts 29 within the vias through interlevel dielectric 28 to top plate of ferroelectric capacitors 20a, 20b; metal post upper portions 31b are also formed to make contact to metal post lower portions 31a, and in turn to polysilicon element 42, field poly elements 42c, and p+ region 36, as the case may be. FIG. 5e illustrates the structure, in plan view, following the formation of metal posts 29 and metal post upper portions 31b into vias etched through interlevel dielectric 28 in process 94. As evident from FIG. 5e, the number and location of vias and metal posts 29 at ferroelectric capacitors 20a, 20b match one another, to ensure close matching in the resulting voltage across each when connected in series and biased.

Standard back end processing is then performed in process 96, including the formation of one or more metal interconnect levels above capacitor structure 20'. This back-end process 96 includes the deposition of a first metal level, followed by pattern and etch, to define metal conductors 36a, 36b, 36c in capacitor structure 20', as shown in FIG. 3b in cross-section, and in FIG. 5f in plan view. FIG. 5f illustrates the location and placement of metal conductors 36a, 36b, 36c. As shown in FIG. 5f, metal conductor 36a interconnects p+ region 46 with top plate 34 of ferroelectric capacitor 20a. Metal conductor 36b interconnects bottom plate 30 of ferroelectric capacitor, via field poly element 42c, to top plate 34 of ferroelectric capacitor 20b. And metal conductor 36c interconnects polysilicon element 42 (the top plate of poly-to-active capacitor 21 of FIG. 2c) to bottom plate 30 of ferroelectric capacitor 20b, via field poly element 42c. The cross-sectional view of FIG. 3b can be visualized through FIG. 5f, as indicated by the view line.

Of course, as indicated above, it is contemplated that variations of and alternatives to the manufacturing process flow described above in connection with FIGS. 4 and 5a through 5f will be apparent to those skilled in the art having reference to this specification. Such variations and alternatives are contemplated to be within the scope of this invention as claimed.

Figure 2D:
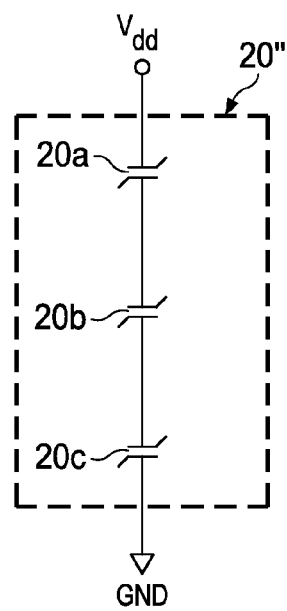

The embodiments of the invention described above are directed to pairs of series-connected ferroelectric capacitors, which may or may not be connected in parallel with another capacitor such as a poly-to-active capacitor. Alternatively, more than two series-connected ferroelectric capacitors may realized, according to embodiments of the invention. FIG. 2d illustrates an example of decoupling capacitor 20" according to this alternative construction, in which three ferroelectric capacitors 20a, 20b, 20c are connected in series with one another between power supply node $V_{dd}$ and ground node GND. Structurally, the interconnection of capacitors 20a, 20b, 20c in such an three-or-more-capacitor arrangement will preferably correspond to that of FIGS. 3a and 3b described above, so that the voltage polarity applied across each of capacitors 20a, 20b, 20c is the same. As described above, this orientation facilitates the equal division of voltage among capacitors 20a, 20b, 20c, minimizing the maximum applied voltage across any one of the three. While the voltage appearing across each capacitor 20a, 20b, 20c is further reduced by the additional capacitor in series, thus reducing the vulnerability to dielectric breakdown, the additional capacitor in series will also reduce the apparent capacitance of the combination, as will be apparent to those skilled in the art. It is contemplated that those skilled in the art having reference to this specification will be readily able to evaluate this tradeoff for particular applications, without undue experimentation.

Figure 6A:
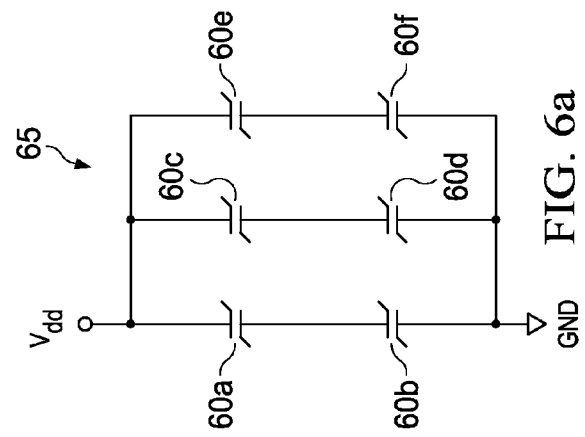
Figure 6B:
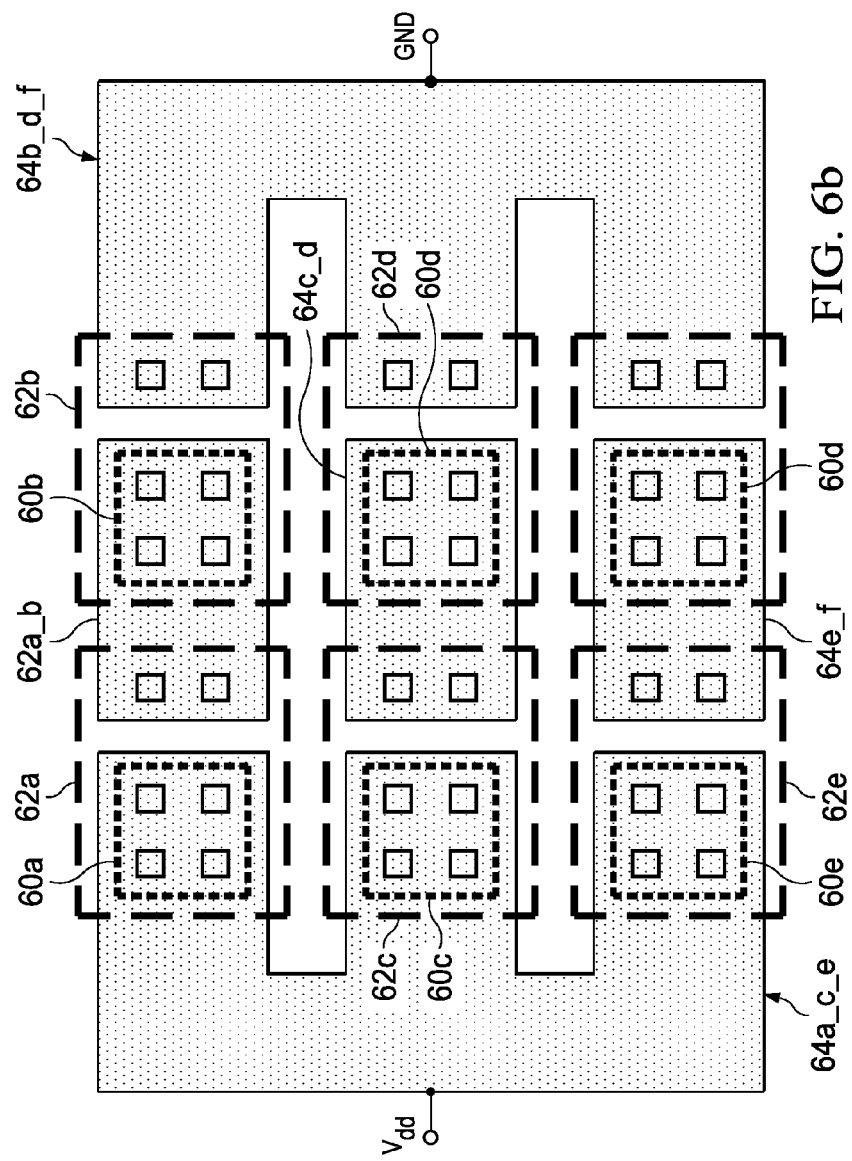

In addition, alternative embodiments of the invention may include more than one pair of series-connected ferroelectric capacitors, connected in parallel. While the voltage across any one of the ferroelectric capacitors in a given pair will not be reduced in such an arrangement, the overall capacitance of the resulting structure is increased with each additional series-connected pair in parallel. FIGS. 6a and 6b illustrate an example of decoupling capacitor 65 in such an arrangement, according to an embodiment of the invention. The electrical schematic of FIG. 6a illustrates that decoupling capacitor 65 includes three series-connected pairs of ferroelectric capacitors, one series-connected pair, including ferroelectric capacitors 60a, 60b, connected in parallel between power supply voltage $V_{dd}$ and ground GND with the series-connected pair of ferroelectric capacitors 60c, 60d, and with the series-connected pair of ferroelectric capacitors 65e, 65f. Assuming that ferroelectric capacitors 60a through 60f are of nominally identical structure and thus capacitance, decoupling capacitor 65 thus provides three times the effective capacitance of a single series-connected pair of ferroelectric capacitors. Nominally equal voltage appears across each of ferroelectric capacitors 60a through 60f, at the voltage $V_{dd}/2$ in this example.

FIG. 6b illustrates, in plan view, a simplified layout of decoupling capacitor 65 according to this embodiment of the invention. Ferroelectric capacitors 60a through 60f, in this example, are of equal area to one another, constructed from the same materials and thicknesses as one another, for example as described above in connection with FIGS. 3a and 3b. Various metal conductors 64 are shown in FIG. 6b, for interconnecting ferroelectric capacitors 60a through 60f among one another according to the schematic of FIG. 6a. For example, metal conductor 64a_c_e is connected to the top plate of each of ferroelectric capacitors 60a, 6c, 6e by way of the appropriate metal posts, and receives power supply voltage $V_{dd}$. The bottom plates of ferroelectric capacitors 60a, 60c, 60e are each connected, by way of corresponding metal posts, to silicon conductor 62a, 62c, 62e, respectively. Silicon conductors 62a, 62c, 62e may be formed by doped (n-type or p-type, as desired) portions of an active region at the semiconducting surface of the substrate, or by polycrystalline silicon elements or the like; in any case, silicon conductors 62a, 62c, 62e physically underlie their corresponding ferroelectric capacitors 60a, 60c, 60e. By way of corresponding metal posts, silicon conductors 62a, 62c, 62e are each connected to a corresponding metal "strap" conductor 64a_b, 64c_d, 64e_f, respectively, which in turn are each connected to the top plate of a corresponding ferroelectric capacitor 60b, 60d, 60f, respectively. The bottom plates of ferroelectric capacitor 60b, 60d, 60f are connected to underlying silicon conductors 62b, 62d, 62f, respectively, by way of metal posts or the like. And additional metal posts connect silicon conductors 62b, 62d, 62f to metal conductor 64b_d_f, which thus couples the bottom plates of ferroelectric capacitors 60b, 60d, 60f to ground node GND.

FIGS. 6c and 6d illustrate an alternative realization of decoupling capacitor 65'. Electrically, as shown in FIG. 6c, decoupling capacitor 65' differs from decoupling capacitor 65 of FIG. 6a by its connecting, in common, the bottom plates of all three upper ferroelectric capacitors 60a, 60c, 60e, to the top plates of all three lower ferroelectric capacitors 60b, 60d, 60f. Essentially, decoupling capacitor 65' is constructed as the series connection of two sets of parallel-connected ferroelectric capacitors, one set including ferroelectric capacitors 60a, 60c, 60e and the other set including ferroelectric capacitors 60b, 60d, 60f.

The construction of decoupling capacitor 65' is shown in FIG. 6d. Ferroelectric capacitors 60a through 60f are constructed similarly as described above relative to FIG. 6b, including metal conductor 64a_c_e connected to the top plate of each of ferroelectric capacitors 60a, 60c, 60e and receiving power supply voltage $V_{dd}$, and metal conductor 64b_d_f connected to corresponding silicon conductors 62b, 62d, 62f, respectively, each in turn connected to the bottom plate of corresponding ferroelectric capacitors 60b, 60d, 60f, respectively. However, single contiguous metal conductor 64a_f is connected to the top plate of all three ferroelectric capacitors 60b, 60d, 60f, and to all three silicon conductors 62a, 62c, 62e, each in turn connected to the bottom plate of corresponding ferroelectric capacitors 60a, 60c, 60e, respectively.

According to this embodiment of the invention, it is contemplated that non-uniformities in capacitance among ferroelectric capacitors 60a through 60f will be mitigated by the parallel connection of the three upper capacitors 60a, 60c, 60e and the parallel connection of the three lower capacitors 60b, 60d, 60f. The effect on the applied voltage across each capacitor 60 due to variations in capacitance at one capacitor in a parallel-connected group will tend to be reduced by the other two capacitors. As such, the construction of FIGS. 6c and 6d will provide some robustness to manufacturing variations, although at increased vulnerability to the shorting-out of any one of the capacitors 60a through 60f.

According to embodiments of this invention, capacitors with large capacitance can be constructed and integrated within an integrated circuit chip, using ferroelectric material such as MOCVD PZT that is well-suited for memory cells but less so for conventional direct capacitors. These large capacitors can have sufficient capacitance to serve as integrated decoupling capacitors or capacitors for "boost" or "bootstrap" circuits, despite constructed as series-connected pairs (or more) of ferroelectric capacitors. The potential for defects due to the rough surface of the ferroelectric material (such as results from conventional MOCVD PZT) is mitigated by the series connection of the ferroelectric capacitors, particularly if well-matched in construction and applied voltage polarity, while still attaining high overall capacitance because of the extremely high dielectric constant of the ferroelectric material. Little if any additional manufacturing complexity is required for implementation of these capacitor structures in integrated circuits with FeRAM resources. Additionally, cooperative structures such as a polysilicon-to-active capacitor can readily be incorporated with the ferroelectric capacitors according to embodiments of this invention, without requiring additional chip area.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of fabricating an integrated circuit, comprising the steps of:
   defining a contiguous active region having first and second portions at the locations of the surface corresponding to a first ferroelectric capacitor and second ferroelectric capacitor;
   forming a dielectric film overlying the first and second portions of the active region;
   defining a contiguous polycrystalline silicon structure having first and second portions overlying the first and second portions of the active region and the dielectric film;
   at locations corresponding to the first and second ferroelectric capacitors:
      depositing a first conductive material;
      then depositing a ferroelectric material;
      then depositing a second conductive material;
   etching the first and second conductive materials and the ferroelectric material, to define the first and second ferroelectric capacitors, the first ferroelectric capacitor overlying the first portion of the active region and the first portion of the polycrystalline silicon structure, and the second ferroelectric capacitor overlying the second portion of the active region and the second portion of the polycrystalline silicon structure; and
   forming a plurality of conductors, a first conductor in electrically-conductive contact with an element of the second conductive material at the first ferroelectric capacitor, a second conductor in electrically-conductive contact with an element of the first conductive material at the second ferroelectric capacitor, and one or more other conductors in electrically-conductive contact with and between an element of the first conductive material at the first ferroelectric capacitor and an element of the second conductive material at the second ferroelectric capacitor;
   wherein the step of defining the contiguous polycrystalline silicon structure simultaneously defines a separate polycrystalline silicon element.

2. The method of claim 1, wherein the step of depositing a ferroelectric material comprises:
   depositing lead-zirconium-titanate (PZT) by metal-organic chemical vapor deposition (MOCVD).

3. The method of claim 1, wherein the etching step defines the first and second ferroelectric capacitors as matching structures.

4. The method of claim 1, further comprising:
   forming an isolation dielectric structure disposed between the locations of the first and second portions of the active region;
   wherein the step of forming one or more other conductors in electrically-conductive contact with and between the element of the first conductive material at the first ferroelectric capacitor to the element of the second conductive material at the second ferroelectric capacitor comprises:
      forming a third conductor in electrically-conductive contact with and between the element of the first conductive material at the first ferroelectric capacitor and the polycrystalline silicon element;
      forming a fourth conductor in electrically-conductive contact with and between the polycrystalline silicon element and a metal strap;
      and forming a fifth conductor in electrically-conductive contact with and between the metal strap and the element of the second conductive material at the second ferroelectric capacitor.

* * * * *